United States Patent
Katayanagi et al.

(10) Patent No.: US 7,229,299 B2
(45) Date of Patent: Jun. 12, 2007

(54) CONNECTOR IMPROVED IN RELIABILITY OF ELECTROSTATIC PROTECTION

(75) Inventors: Masayuki Katayanagi, Tokyo (JP); Hiroki Kamata, Tokyo (JP)

(73) Assignee: Japan Aviation Electronics Industry, Limited, Tokyo (JP)

(*) Notice: Subject to any disclaimer, the term of this patent is extended or adjusted under 35 U.S.C. 154(b) by 0 days.

(21) Appl. No.: 11/502,881

(22) Filed: Aug. 11, 2006

(65) Prior Publication Data

US 2007/0037417 A1 Feb. 15, 2007

(30) Foreign Application Priority Data

Aug. 12, 2005 (JP) ............... 2005-233988

(51) Int. Cl.
*H01R 4/66* (2006.01)
(52) U.S. Cl. ............... 439/95; 439/946; 439/76.1; 439/181
(58) Field of Classification Search ......... 439/76.1, 439/95, 945, 946, 947, 181
See application file for complete search history.

(56) References Cited

U.S. PATENT DOCUMENTS 5,210,442 A * 5/1993 Ishimoto ............... 257/679
5,564,933 A * 10/1996 Bouchan et al. ......... 439/76.1
5,603,620 A * 2/1997 Hinze et al. ............... 439/95
5,749,741 A * 5/1998 Bellas et al. ............... 439/95
6,008,994 A * 12/1999 Bates ...................... 361/737
6,457,982 B1 * 10/2002 Ko et al. .................... 439/95

FOREIGN PATENT DOCUMENTS

JP 3252257 7/1999

\* cited by examiner

Primary Examiner—Tho D. Ta
(74) Attorney, Agent, or Firm—Collard & Roe, P.C.

(57) ABSTRACT

In a connector for use in an electronic card having a circuit board and a case containing the circuit board, a housing holds a ground connection terminal and a contact. The ground connection terminal has a press-fit portion press-fitted to and held by the housing, a contacting portion connected to the press-fit portion and adapted to be contacted with the case, and a terminal portion connected to the press-fit portion and adapted to be connected to the circuit board. The housing has a guide portion for guiding the contacting portion when the press-fit portion is press-fitted to the housing. The contacting portion is connected to the case with elastic displacement inside the guide portion.

9 Claims, 2 Drawing Sheets

CONNECTOR IMPROVED IN RELIABILITY OF ELECTROSTATIC PROTECTION

This application claims priority to prior Japanese patent application JP 2005-233988, the disclosure of which is incorporated herein by reference.

BACKGROUND OF THE INVENTION

This invention relates to a connector for use with an electronic card called a PC (Portable Computer) card or an Express card and, in particular, to a connector with electrostatic protection.

An electronic card of the type is disclosed, for example, in Japanese Patent (JP-B) No. 3252257 and comprises a connector to be connected to an electronic apparatus. The connector includes a ground connection terminal as protection against electrostatic charges accumulating on the electronic card. The ground connection terminal has a contacting portion electrically connected to upper and lower covers of the electronic card and a printed board. Therefore, electrostatic charges accumulated on the electronic card are released through the ground connection terminal to a ground of the printed board.

In the above-mentioned connector, the ground connection terminal is formed by press-bending. Therefore, it is impossible to achieve a sufficiently high contacting force of the contacting portion. Further, the ground connection terminal is provided with a bent portion and a spring portion in the vicinity of the contacting portion but no guide is formed around the bent portion and the spring portion. Therefore, due to variations in an assembling process of the connector or upon reception of mechanical shock, the ground connection terminal may be deformed in a direction other than a contacting direction of the contacting portion, i.e., other than a thickness direction of the card. Further, the contacting portion is formed on a flat surface of the bent portion. Therefore, if an oxide film or the like is formed on a surface of each cover, the contacting portion is contacted with the cover via the oxide film. This results in contact failure.

Because of the above-mentioned problems, the connector according to the conventional technique is insufficient in contact reliability and stability of ground connection. Further, if a mounting height of the connector with respect to the printed board is changed, i.e., if a position of the connector in a thickness direction of the card is changed, it is necessary to change a press-bending process and a punching process for a SMT soldering portion of a ground member. This requires much time and labor and high cost for reconstruction.

SUMMARY OF THE INVENTION

It is therefore an object of this invention to provide a connector improved in reliability of electrostatic protection.

It is another object of this invention to provide a connector with electrostatic protection, which is flexibly adaptable to various mounting heights.

It is still another object of this invention to provide an electronic card including the above-mentioned connector.

Other objects of the present invention will become clear as the description proceeds.

According to an aspect of the present invention, there is provided a connector for use in an electronic card comprising a circuit board and a case containing the circuit board. The connector comprises a ground connection terminal, a contact, and a housing holding the ground connection terminal and the contact, the ground connection terminal having a press-fit portion press-fitted to and held by the housing, a contacting portion connected to the press-fit portion and adapted to be contacted with the case, and a terminal portion connected to the press-fit portion and adapted to be connected to the circuit board, the housing having a guide portion for guiding the contacting portion when the press-fit portion is press-fitted to the housing, the contacting portion being connected to the case with elastic displacement inside the guide portion.

According to another aspect of the present invention, there is provided an electronic card comprising a circuit board, a case containing the circuit board, and the above-mentioned connector coupled to the case.

DESCRIPTION OF THE PREFERRED EMBODIMENTS

Figure 1:
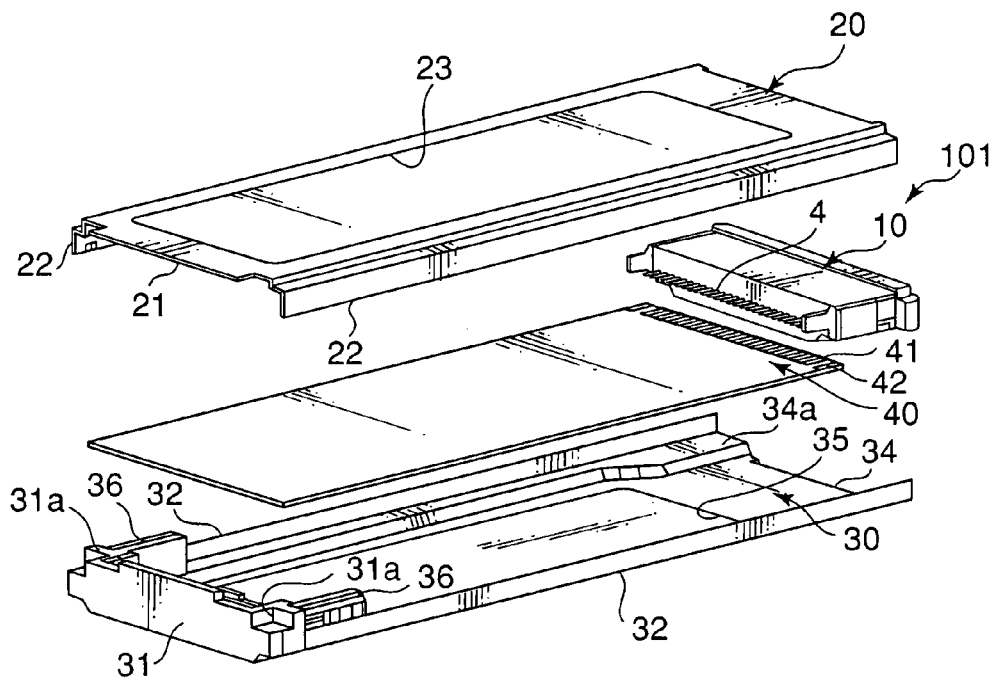
FIG. 1 is a perspective view of an electronic card according to an embodiment of this invention in a disassembled state.

Referring to FIG. 1, description will be made about an electronic card according to an embodiment of this invention. For convenience of description, a left side of the electronic card in FIG. 1 will be called a front side while a right side with a connector equipped will be called a rear side.

The electronic card is depicted by a reference numeral 101 and comprises a connector 10, a metallic top cover 20, a metallic bottom cover 30, and a circuit board or a printed board 40. The top cover 20 and the bottom cover 30 are fixed to each other after the connector 10 and the printed board 40 are incorporated therebetween. Thus, the electronic card 101 generally in the form of a thin plate is produced.

The top cover 20 has a U-shaped section and comprises a top portion 21 and a pair of side plates 22 on opposite side of the top portion 21. The top portion 21 of the top cover 20 has a recessed plane portion 23 formed on an outer surface thereof. The recessed plane portion 23 may be used to receive a label attached thereto.

The bottom cover 30 comprises an insulating front plate 31, a bottom portion 34, and a pair of side plates 32 formed on opposite sides of the bottom portion 34. The bottom portion 34 has a recessed plane portion 35 formed on an inner surface thereof. The bottom cover 30 further has a platform portion 34a protuberating from the bottom portion 34 to form a step and a pair of positioning members 36 disposed adjacent to the side plates 32 to position the printed board 40. The front plate 31 has a pair of recessed portions 31a formed on opposite front sides thereof, respectively.

Figure 2:
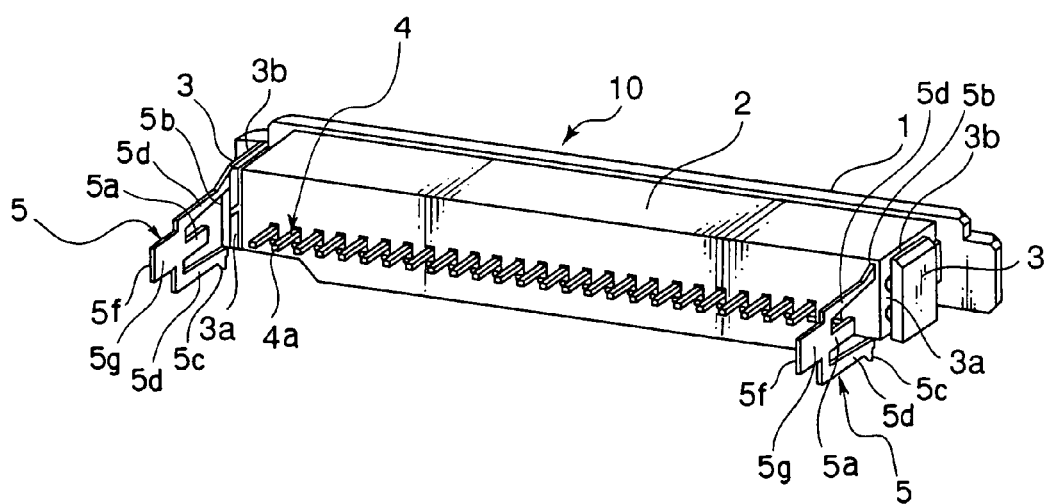
FIG. 2 is an exploded perspective view of a connector in the electronic card illustrated in FIG. 1.

Referring to FIG. 2 in addition, the connector 10 will be described in detail.

The connector 10 comprises an insulating housing 2 having a flat rear plate 1 formed outside. The housing 2 has a pair of protruding members 3 formed on opposite sides thereof. The connector 10 further comprises a plurality of signal connection terminals or contacts 4 planted in an intermediate portion on a front side (inner side) of the housing 2 and arranged in parallel to one another in a widthwise direction of the electronic card 101, i.e., a transversal direction in FIG. 2 and a pair of ground connection terminals (hereinafter referred to as ground lugs) 5 disposed on opposite sides of the housing 2.

Each of the contacts 4 has a soldering terminal portion 4a. Each of the protruding members 3 of the housing 2 has a holding groove 3a formed on the inner side thereof and a pair of guide grooves 3b formed on upper and lower sides thereof, respectively.

Each ground lug 5 is formed by press-punching a metal plate. Each ground lug 5 has a press-fit portion 5a extending from a base portion 5g and a pair of spring portions 5d extending from the base portion 5g on opposite sides of the press-fit portion 5a. The spring portions 5d extend in parallel to the press-fit portion 5a. The spring portions 5d extend beyond the press-fit portion 5a and have contacting portions 5b and 5c formed on their ends, respectively. In other words, each of the contacting portions 5b and 5c is connected to the press-fit portion 5a through the base portion 5g and each of the spring portions 5d.

A terminal portion 5f extends from the base portion 5g in a direction opposite to the press-fit portion 5a and the spring portions 5d. In other words, the terminal portion 5f is connected to the press-fit portion 5a through the base portion 5g. The terminal portion 5f has a lower surface serving as a soldering terminal portion (mounting portion) 5e.

The ground lugs 5 are positioned on opposite sides of an array of the contacts 4. The press-fit portions 5a are press-fitted into the holding grooves 3a of the housing 2 to be fixed to the housing 2. The contacting portions 5b and 5c of the ground lugs 5 are located in the guide grooves 3b of the housing 2 and freely movable inside the guide grooves 3b in a vertical direction or a card thickness direction. The spring portions 5d of the ground lugs 5 are also guided by the guide grooves 3b of the housing 2 so that the spring portions 5d are displaceable in the vertical direction but are prevented from being deformed in the transversal direction.

Figure 3:
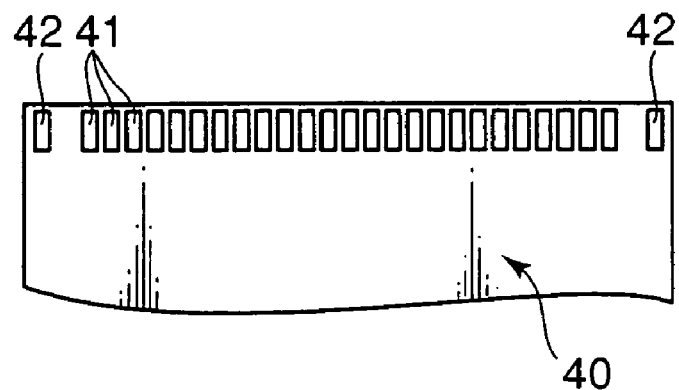
FIG. 3 is a plan view showing a characteristic part of a printed board in the electronic card illustrated in FIG. 1.

Referring to FIG. 3, the printed board 40 will be described.

The printed board 40 has a plurality of signal pads 41 formed on a surface of its one end and corresponding in position and number to the contacts 4, and a pair of ground pads 42 formed outside the signal pads 41 and corresponding in position to the ground lugs 5. The signal pads 41 are connected by soldering to the soldering terminal portions 4a of the contacts 4, respectively. On the other hand, the ground pads 42 are soldered to the soldering terminal portions 5e of the ground lugs 5, respectively.

Figure 4:
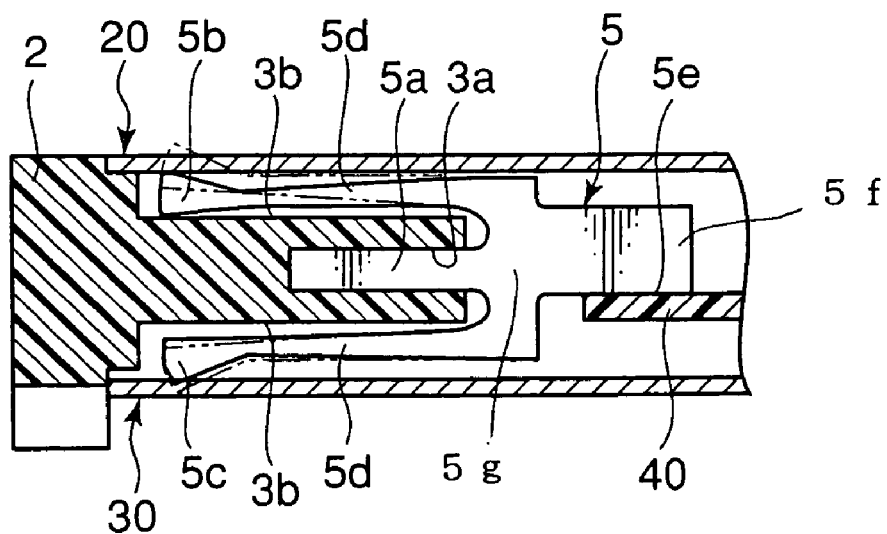
FIG. 4 is a sectional view of a part of the electronic card in FIG. 1 in an assembled state.

Referring to FIG. 4, description will be made of a relationship among the ground lugs 5, the printed board 40, and the top and the bottom covers 20 and 30.

The soldering portions 5e of the ground lugs 5 are soldered to the ground pads 42 of the printed board 40, respectively. One contacting portion 5b of each ground lug 5 is contacted with the top cover 20 while the other contacting portion 5c of each ground lug 5 is contacted with the bottom cover 30. Under spring force of the spring portions 5d, these contacting portions 5b and 5c are pressed from inside to outside in the card thickness direction against the top cover 20 and the bottom cover 30, respectively.

Since the ground lugs 5 are formed by press-punching, the spring portions 5d have a high spring constant. Therefore, the contacting portions 5b and 5c can be brought into contact with the top and the bottom covers 20 and 30 with sufficient contacting force. Thus, reliability of contact is high.

In the contacting portions 5b and 5c, those parts actually contacted with the top and the bottom covers 20 and 30 are fracture surfaces formed by press-punching and have a sharp-pointed shape. Therefore, even if an oxide film or the like is formed on a contacting portion of each of the top and the bottom covers 20 and 30, reliable electric connection is established without being affected by the oxide film.

In the soldering portion 5e also, a fracture surface formed by press-punching serves as a contacting surface to be contacted with the printed board 40. Therefore, even if a mounting height in the card thickness direction is changed, a position of the contacting surface to be contacted with the pad can be changed simply by changing a press-punching pattern. Therefore, it is possible to reduce time and labor as well as a cost for reconstruction of a press die.

Further, the contacting portions 5b and 5c and the spring portions 5d of the ground lugs 5 are prevented by the guide grooves 3b of the housing 2 from being deformed in the transversal direction. Therefore, even upon occurrence of variations in a card assembling process or upon reception of mechanical shock, ideal spring deformation is always assured and stable contacting force can be achieved.

With the electronic card 101 mentioned above, it is possible to always reliably release electrostatic charges accumulated on the covers to a ground of the printed board without being affected by a surface condition of the covers contacted with the contacting portions 5b and 5c or variations in the production process. In the ground lug 5, the contacting surface of the soldering portion 5e to be soldered to the printed board 40 is formed by a fracture surface obtained by press-punching. Therefore, even if the mounting height of the connector 10 with respect to the printed board 40 is changed, it is possible to easily meet such change simply by modifying a size of the terminal portion 5f in a widthwise direction (vertical direction in FIG. 4) to thereby change a position of the soldering portion 5e, i.e., simply by changing a press-punching pattern. Therefore, time and labor as well as a cost for reconstruction can be reduced.

The above-mentioned electronic card may be implemented as a PC card, an Express card known in the art, and so on for use with a notebook-type personal computer.

Although this invention has been described in conjunction with a preferred embodiment thereof, this invention may be modified in various other manners within the scope of the appended claims.

What is claimed is:

1. A connector for use in an electronic card comprising a circuit board and a case containing the circuit board, the connector comprising:

a ground connection terminal formed by press-punching a flat plate to have a flat plate shape;

a contact; and a housing holding the ground connection terminal and the contact;

the ground connection terminal comprising:

a press-fit portion press-fitted to and held by the housing;

a spring portion integral with the press-fit portion;

a contacting portion integral with the spring portion and having an edge which is subjected to the press-punching and adapted to be contacted with the case; and a terminal portion integral with the press-fit portion and adapted to be connected to the circuit board;

the housing having a guide portion for guiding the contacting portion and the spring portion in a state where the press-fit portion is press-fitted to the housing;

the edge of the contacting portion being brought into press contact with the case with elastic displacement inside the guide portion when the housing is coupled to the case.

2. The connector according to claim 1, wherein the spring portion is positioned between the press-fit portion and the contacting portion.

3. The connector according to claim 1, wherein the terminal portion has a mounting portion faced to the circuit board, the mounting portion being a fracture surface formed by press-punching.

4. The connector according to claim 1, wherein the contacting portion is a fracture surface formed by press-punching and has a sharp-pointed shape.

5. The connector according to claim 1, wherein the housing has a press-fit hole, the press-fit portion being press-fitted into the press-fit hole.

6. An electronic card comprising:
a circuit board;
a case containing the circuit board; and
the connector according to claim 1 and coupled to the case.

7. The connector according to claim 1, wherein the ground connection terminal is disposed on at least one of opposite sides of the housing, the contact being disposed between the opposite sides.

8. The connector according to claim 7, wherein the contact has a terminal portion to be connected to the circuit board, the terminal portion of the ground connection terminal and the terminal portion of the contact extending from the housing in the same direction.

9. The connector according to claim 8, wherein the terminal portion of the ground connection terminal and the terminal portion of the contact being disposed on one plane.

* * * * *